United States Patent
Rossi

(10) Patent No.: US 11,277,942 B2
(45) Date of Patent: Mar. 15, 2022

(54) HEAT DISSIPATION DEVICE FOR AN ELECTRONIC CARD

(71) Applicant: EUROTECH S.p.A., Amaro (IT)

(72) Inventor: Mauro Rossi, Gemona del Friuli (IT)

(73) Assignee: EUROTECH S.p.A., Amaro (IT)

( * ) Notice: Subject to any disclaimer, the term of this patent is extended or adjusted under 35 U.S.C. 154(b) by 387 days.

(21) Appl. No.: 16/343,904

(22) PCT Filed: Oct. 24, 2017

(86) PCT No.: PCT/IB2017/056586
§ 371 (c)(1),
(2) Date: Apr. 22, 2019

(87) PCT Pub. No.: WO2018/078522
PCT Pub. Date: May 3, 2018

(65) Prior Publication Data
US 2021/0289668 A1   Sep. 16, 2021

(30) Foreign Application Priority Data

Oct. 24, 2016  (IT) .......................... 102016000107037

(51) Int. Cl.
*H05K 7/20* (2006.01)
*G06F 1/18* (2006.01)

(52) U.S. Cl.
CPC ......... *H05K 7/20509* (2013.01); *G06F 1/186* (2013.01)

(58) Field of Classification Search
CPC .............. H05K 7/20509; H05K 7/1407; G06F 1/185–186
See application file for complete search history.

(56) References Cited

U.S. PATENT DOCUMENTS

| | | | | |
|---|---|---|---|---|
| 5,733,137 A | * | 3/1998 | Knoop ................. | H05K 7/1407 29/432.2 |
| 5,966,289 A | | 10/1999 | Hastings et al. | |
| 6,128,196 A | | 10/2000 | Hoyle, Jr. et al. | |
| 6,411,517 B1 | * | 6/2002 | Babin .................... | H01R 23/70 361/759 |
| 9,363,919 B2 | * | 6/2016 | Ke ....................... | H05K 7/1418 |
| 2004/0022045 A1 | | 2/2004 | Ishida | |

FOREIGN PATENT DOCUMENTS

| | | | | |
|---|---|---|---|---|
| EP | 1072178 A1 | | 1/2001 | |
| GB | 2305300 A | * | 4/1997 | ........... H05K 7/1407 |

OTHER PUBLICATIONS

International Search Report and Written Opinion from PCT/IB2017/056586 dated Feb. 6, 2018 (9 pages).

\* cited by examiner

*Primary Examiner* — Robert J Hoffberg

(57) ABSTRACT

Heat dissipation device for an electronic board comprising a support body connected to the electronic board, said electronic board being provided with an electric connection interface which can be inserted into/extracted from an electric connector provided in a direction orthogonal with respect to the lying plane of a support plate, having a heat dissipation surface configured to dissipate the heat transmitted to it by thermal conduction, wherein said heat dissipation device comprises at least one holding element and a leveling member, coordinated with respect to each other in order to position a surface of the support body in contact with the heat dissipation surface of the support plate.

14 Claims, 3 Drawing Sheets

HEAT DISSIPATION DEVICE FOR AN ELECTRONIC CARD

CROSS-REFERENCE TO RELATED APPLICATIONS

This application is a 371 of PCT Application No. PCT/IB2017/056586 filed on Oct. 24, 2017, which claim priority to Italian Application No. 102016000107037 filed on Oct. 24, 2016, the contents of which are hereby incorporated by reference as if recited in their entirety.

FIELD OF THE INVENTION

Embodiments of the present invention concern a heat dissipation device for an electronic board, used for example in the field of high performance computing units, supercomputers, or high performance computing systems, or other units that do not provide forced air cooling systems which require a high degree of electronic integration and an extensive dissipative capacity to maximize the electric power density that can be managed.

In particular, the present invention is applicable to electronic boards with an electric connection interface made in a direction orthogonal to the insertion/extraction direction into/from the system, such as for example PCIe (Peripheral Component Interconnect Express) electronic boards, and also to other electronic boards having a similar and/or comparable shape factor and/or electric interconnection interface and/or layout.

BACKGROUND OF THE INVENTION

High performance processing units, for example in the field of supercomputers, typically provide a support plate provided with a plurality of electric connectors, where electronic boards are installed.

The electronic boards in question are the "card edge" type, that is, they have a series of electric contacts, also called "gold fingers", and can be removably inserted into electric connectors, also known as sockets, present on the support plate of the processing unit.

By way of non-restrictive example, by removable electronic boards we also mean node cards of a server system, electronic expansion cards, Line Replaceable Units (LRU), Field Replaceable Units (FRU), or other similar or comparable electronic boards that can be installed without needing to be disassembled, also the customized type. Other electronic boards to which this description refers are those with an electric interface connection of the "board to board" type.

The present disclosure does not refer to systems based on a blade architecture, connectable through a rear backplane, which make the connection in the same direction of insertion/extraction into/from the system.

For these electronic boards, connection and heat dissipation devices are known that are very complex and cannot be generalized to different electronic boards, such as for example PCIe electronic boards.

In this context, it is required to achieve a high degree of electronic integration and therefore high power densities, which means that the electronic boards have to be highly compact.

In order to avoid exceeding the temperature limit values, the electronic boards need to be greatly cooled, so as not to cause malfunctions and/or irreversible damage.

Various types of cooling techniques are known, such as for example forced air cooling, heat-carrier fluid cooling, or techniques that use passive heat dissipation devices.

Cooling obtained by means of forced air, or with heat-carrier fluid, passing between the electronic boards, normally have volumes that limit the power density obtainable, and require complex assemblies with numerous additional elements, such as for example the conduits where the heat-carrier fluid flows.

In this context, the cooling obtained by means of passive heat dissipation devices is preferable, since it is simple to obtain and, in the event of a malfunction, the probability of damage to the various components is lower than other types of cooling.

One of the preferred solutions, using passive heat dissipation devices, provides to use a cooling plate, also known as a "cold plate", which comprises integrated conduits in which a cooling fluid flows.

To guarantee maximum heat dissipation efficiency, the cooling plates require a reliable and extensive heat coupling between the cooling plates and the electronic boards installed on them.

Two main types of insertion/extraction of electronic boards into/from electric connectors are known, but they do not always guarantee a reliable and extensive thermal and mechanical coupling with the cooling plate for any type of electronic board.

Blade-type electronic boards are known, in which the electric and mechanical connection is obtained by inserting the electronic boards in a longitudinal insertion direction, until they are connected to an electric connector located at the end-of-travel, perpendicular to the insertion direction. In this case, the electric connector is on a "backplane".

Electronic boards inserted orthogonally are also known which, once positioned above the electric connectors, are inserted/extracted orthogonally to the longitudinal extension of the electric connectors.

When it is possible to access the electric connectors exclusively in a direction parallel to the longitudinal extension of the electric connectors, the orthogonally inserted electronic boards are not easy to use in the processing units of the invention because they are difficult to position, but above all, even if installed, do not guarantee a reliable and extensive mechanical, heat and electric coupling.

Document U.S. 2004/0022045 describes a rack for mounting electronic boards, which uses a forced air cooling system with fans provided on the internal faces of the panels that contain the rack. The electronic boards are mounted on the top and bottom faces of a motherboard using connectors provided on these faces.

This document also provides a guide system to guide into position the single electronic board with respect to its position associated with the motherboard. This document does not show solutions to obtain dissipation of the heat produced by thermal conduction functioning between a cooling plate and a surface suitable for the reciprocal contact heat transmission.

In this case, the only contact with the motherboard is given by the electric connectors that are not configured to dissipate the heat, but to connect the electronic board electrically to the motherboard itself, which in turn is distanced from the electronic board, being itself a source of heat.

U.S. Pat. No. 5,966,289 (U.S.' 289) describes a system for mounting an electronic component, such as a CPU, in which a support and a clamping element coupled to the support are provided.

The support comprises a finned heat dissipater that develops substantially parallel to an electronic board. The heat dissipater is mounted on a face of the housing where the electronic board is installed and, thanks to its finned configuration, has the function of dissipating the heat generated by the electronic board during functioning.

This document also does not show solutions to obtain a dissipation of the heat produced by thermal conduction functioning between a cooling plate and a surface suitable for reciprocal contact heat transmission.

In this case too, the system board is distanced from the housing of the electronic board, since the system board is a source of heat.

Document U.S.' 289 shows a fin in contact with a reference surface of a mechanical support so as to keep the housing distanced from the system board.

There is therefore a need to perfect the state of the art and make available a heat dissipation device for an electronic board that overcomes at least one of the disadvantages of the state of the art.

The purpose of the present invention is to obtain a heat dissipation device for electronic boards that can be installed orthogonally with respect to the direction defined by the longitudinal extension of the electric connector which allows to obtain a reliable mechanical and electric coupling, as well as a reliable and extensive heat coupling, so as to guarantee effective heat dissipation between the electronic board installed and the support plate, possibly provided with a cooling plate.

Another purpose of the present invention is to perfect the installation of orthogonally inserted electronic boards, even if only one access is available in a direction parallel to the longitudinal extension of the electric connector, so as to obtain a reliable and extensive heat coupling with the support plate.

The Applicant has devised, tested and embodied the present invention to overcome the shortcomings of the state of the art and to obtain these and other purposes and advantages.

SUMMARY OF THE INVENTION

The present invention is set forth and characterized in the independent claims, while the dependent claims describe other characteristics of the invention or variants to the main inventive idea.

In accordance with the above purposes, the present invention concerns a heat dissipation device for an electronic board comprising a support body connected to the electronic board, wherein said electronic board is provided with an electronic connection interface which can be inserted into/extracted from a plurality of electric connectors provided on a corresponding support plate in a direction orthogonal with respect to the lying plane of the support plate, and wherein said support plate has a heat dissipation surface configured to dissipate the heat transmitted to it by thermal conduction.

The support plate can comprise a heat dissipation plate of the so-called "cold plate" type, provided with grooves in correspondence with electric connectors. In this case, the heat dissipation surface of the support plate corresponds with the upper surface of the "cold plate" heat dissipation plate.

In accordance with one aspect of the present invention, the heat dissipation device also comprises:
at least one holding element provided on the heat dissipation surface;
a leveling member, connected to the support body and comprising a retaining body coordinated with the at least one holding element in order to position a surface of the support body designated for transmission of heat, in contact with the heat dissipation surface, at least one of either the retaining body or the at least one holding element being positionable in a direction orthogonal with respect to the surface of the support body or to the heat dissipation surface of the support plate respectively.

According to possible embodiments, the heat dissipation device can also comprise a guide element to ensure the association/disassociation of the electric connector with the electric connection interface.

For example, in the case of PCIe electronic boards installable on support plates with a "cold plate" heat dissipation plate provided with grooves, the guide element consists of the groove that cooperates with the holding element, in order to ensure the correct positioning of the PCIe electronic board.

According to possible embodiments, the leveling member comprises adjustment means able to position the retaining body in a direction orthogonal with respect to the surface of the support body.

According to a variant, the holding element can comprise further adjustment means able to position the holding element in a direction orthogonal with respect to the heat dissipation surface of the support plate.

The present invention allows to be able to install/remove an orthogonally inserted electronic board even when access and positioning of the electronic board, with respect to the electric connector, is possible in only one direction, defined as the direction parallel to the longitudinal extension of the electric connector.

In accordance with possible formulations, the present invention also concerns a method to insert/remove a heat dissipation device that provides:
a step of engaging/disengaging a retaining body with at least one holding element;
a step of positioning the heat dissipation device in a direction orthogonal with respect to the heat dissipation surface until the surface of the support body is thermally coupled with/uncoupled from the heat dissipation surface of the support plate, positioning at least one of either the retaining body or the holding element in a direction orthogonal with respect to the surface of the support body or to the heat dissipation surface of the support plate, respectively.

According to possible embodiments, the step of positioning the heat dissipation device is performed using compression/decompression.

BRIEF DESCRIPTION OF THE DRAWINGS

These and other characteristics of the present invention will become apparent from the following description of some embodiments, given as a non-restrictive example with reference to the attached drawings wherein.

To facilitate comprehension, the same reference numbers have been used, where possible, to identify identical common elements in the drawings. It is understood that elements and characteristics of one embodiment can conveniently be incorporated into other embodiments without further clarifications.

DETAILED DESCRIPTION OF SOME EMBODIMENTS

Figure 1:
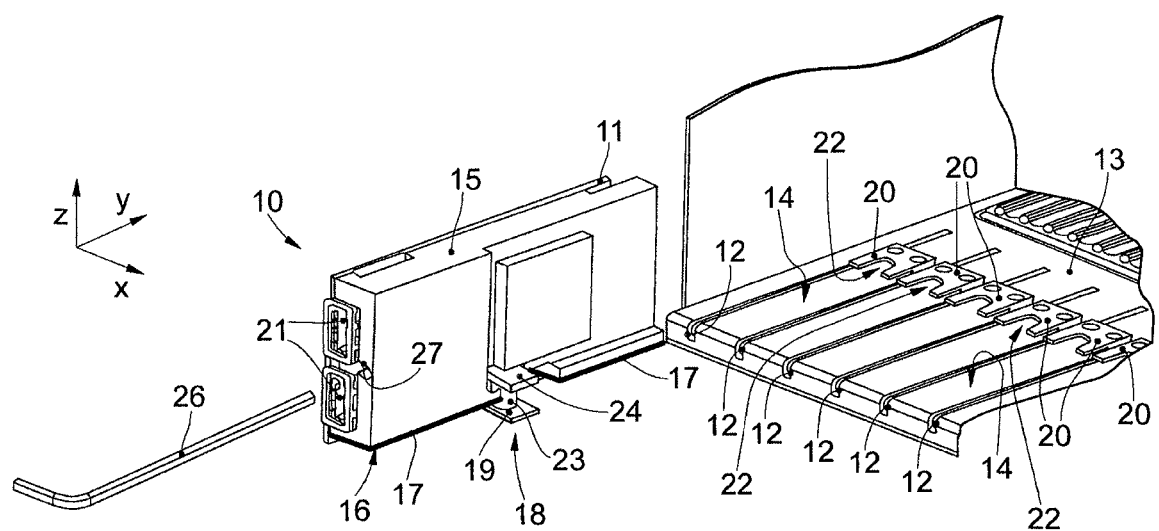
FIG. 1 is an exploded view of a heat dissipation device according to one embodiment of the present invention.
Figure 2:
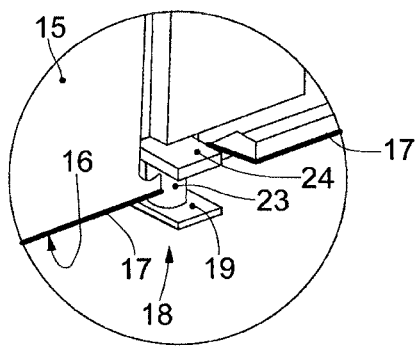
FIG. 2 is a view of a detail of FIG. 1.

With reference to FIGS. 1-6, which show non-restrictive examples of the invention, we will now describe embodiments of a heat dissipation device 10 for an electronic board 11 orthogonally inserted inside one of a plurality of electric connectors 12 provided on a support plate 13.

The electronic board is provided with an electric connection interface 11a which can be inserted/removed into/from an electric connector 12 in an orthogonal direction with respect to the lying plane of the support plate 13; the support plate 13 also has a heat dissipation surface 14 configured to dissipate the heat transmitted thereto by thermal conduction.

The electric connection interface 11a can comprise a plurality of electric contacts 111, also called "gold fingers", which can be associated with corresponding electric contacts 12a provided in the electric connector 12.

According to possible embodiments, the support plate 13 can have a plurality of electric connectors 12 each having a defined longitudinal extension.

The directions X, Y, Z are identified in the drawings as respectively the direction defined by the lateral extension of the support plate 13, the direction defined by the longitudinal extension of the electric connector 12 and the direction orthogonal to both directions X and Y.

In one embodiment, the heat dissipation surface 14 can integrate inside it the conduits where a cooling fluid flows, which allow to dissipate the heat transmitted thereto, at the same time cooling the element with which they are in contact.

According to possible embodiments, the support plate 13 can comprise a base electronic board 13a and a cold plate heat dissipation plate 13b located on the base electronic board 13a and provided with grooves 33 in correspondence with the electric connectors 12.

In this case, the heat dissipation surface 14 of the support plate 13 corresponds to the upper surface of the cold plate heat dissipation plate 13b.

In particular, the heat dissipation surface 14 can be identified as a surface defined by the lying plane of the support plate 13.

As will be clear from the description, the function of the support plate 13 is to dissipate the heat of the elements in contact with its heat dissipation surface 14, that is, the function of dissipating the heat generated or coming from these elements.

To guarantee the maximum heat dissipation efficiency through the heat dissipation surface 14, and hence through the support plate 13, a uniform, extensive and effective heat coupling is required between the contact surface of the element that generates or transmits heat with the support plate 13 and heat dissipation surface 14.

According to possible embodiments, the heat dissipation device 10 can comprise a support body 15 connected to an electronic board 11.

According to another aspect of the present invention, the heat dissipation device 10 can comprise:
- at least one holding element 20 provided on the heat dissipation surface 14;
- a leveling member 18, connected to the support body 15, and comprising a retaining body 19 coordinated with the at least one holding element 20 to position a surface 16 of the support body 15 suitable for heat transmission in contact with the heat dissipation surface 14, at least one of either the retaining body 19 and the at least one holding element 20 being positioned in an orthogonal direction with respect to the surface 16 of the support body 15 or the heat dissipation surface 14 of the support plate 13, respectively.

The heat to be dissipated is generated, for example, by the electronic components present on the electronic board 11.

The solution illustrated above allows to define an extensive coupling between the surface 16 of the support body 15 and the heat dissipation surface 14 of the support plate 13.

According to possible embodiments, the support body 15 can be laterally connected to the electronic board 11 and/or can comprise one or more heat dissipation elements.

According to these embodiments, the connection of the support body 15 laterally to the electronic board 11 allows to dissipate the heat coming from a large region of the electronic board 11.

According to possible embodiments, the support body 15 can also comprise electric and/or electronic components that cooperate with the electronic board 11 to perform certain functions according to the design needs.

The heat dissipation elements comprised in the support body 15 can be configured to disperse the heat generated by the electronic components installed on the electronic board 11, particularly in the hot spots, for example, consisting of integrated power, processing or memory circuits.

According to possible embodiments, if the electronic board 11 is made according to the Peripheral Component Interconnect express (PCI express) standard, or another electronic board 11 having a shape factor and/or electric interconnection interface and/or similar and/or comparable layout, the support body 15 can comprise and disperse the heat generated by a coupled electronic board also called, in the present case, "PCIe daughter card".

According to possible embodiments, the support body 15 can also comprise one or more connectors 21 configured to connect cables or install additional electric and/or electronic devices to the electronic board 11.

According to possible embodiments, the support body 15 can comprise one or more elements chosen from a group consisting of: electric and/or electronic components, dispersion elements, dissipation and thermal interface elements, an electronic board coupled to said electronic board 11, connectors 21.

According to possible embodiments, the surface 16 of the support body 15 can be identified as an orthogonal surface with respect to the direction of insertion of the electronic board 11 into the electric connector 12.

According to possible embodiments, the surface 16 can comprise a heat-conductive interface 17 comprising a thermal interface material, also referred to as "Thermal Interface Material" or TIM.

This allows to have an efficient heat exchange, during operations, between the surface 16 of the support body 15 and the heat dissipation surface 14 of the support plate 13.

In order to make the heat and mechanical coupling reliable and extensive, according to advantageous embodiments, the heat-conductive interface 17 can comprise a highly deformable heat-conductive material, also referred to as "Soft-TIM", so that it can be located, during the coupling step, under pressure and in safe contact for part or all of the extension of the heat dissipation surface 14 of the support plate 13.

This allows to guarantee an optimal heat exchange due to contact between the surface 16 provided with the heat-conductive interface 17 and the heat dissipation surface 14 of the support plate 13.

According to possible embodiments, after having associated the retaining body 19 to the holding element 20, the leveling member 18 allows to couple, even under pressure, the support body 15 to the heat dissipation surface 14 of the support plate 13, while at the same time fixing the position with respect to the support plate 13.

According to possible embodiments, if there is a cold plate heat dissipation plate 13b, the grooves 33 provided thereon can function as guide elements to position the electronic boards 11 with respect to the electric connectors 12 of the support plate 13.

According to possible embodiments, the retaining body 19 can comprise a flat body with a defined thickness, such as for example a flange or similar and/or comparable body.

According to possible embodiments, the support plate 13 can be provided with a plurality of holding elements 20 disposed in proximity to each electric connector 12. For example, the holding elements 20 can be positioned and attached in a position defined at the side of the electric connector 12.

The position of the holding elements 20 is defined so as to position the support body 15, and therefore the electronic board 11 connected to it, precisely and univocally, since the holding element 20 also functions as a reference for the insertion position of the electronic board 11.

According to possible embodiments, the holding element 20 can be attached to the support plate 13 by attachment elements, such as for example pegs, threaded elements, or similar and/or comparable elements, or even welded to the heat dissipation surface 14.

According to possible embodiments, the holding element 20 can comprise a housing seating 22, mating in shape with the shape of the retaining body 19, in order to house the latter.

According to possible embodiments, the holding element 20 can be conformed so that a portion thereof is attached to the support plate 13 and another portion thereof is distanced from the heat dissipation surface 14 at a distance mating with the shape, that is, with the thickness, of the retaining body 19, so as to configure a housing seating 22 where the retaining body 19 is inserted.

According to possible embodiments, the leveling member 18 can comprise a main body 23 connected to the retaining body 19 and positioned orthogonally with respect to the surface 16 of the support body 15.

In this case, the portion that makes the housing seating 22 is also conformed to house the main body 23. For example, if the main body 23 is shaped like a cylinder, the housing seating 22 can comprise a C-shaped portion.

According to possible embodiments, the leveling member 18 can also comprise an additional retaining body 24 disposed in a predetermined position of the main body 23.

This additional retaining body 24 allows to fix the position of the support body 15, avoiding unwanted movements of the support body 15 and thus of the electronic board 11.

In fact, when the surface 16 and the heat dissipation surface 14 are coupled to each other, the predetermined position is defined so that in operation, the other retaining body 24 cooperates with the retaining body 19 to clamp in a vise-like manner a portion of the holding element 20.

According to possible embodiments, the leveling member 18 comprises adjustment means 25 able to position the retaining body 19 in an orthogonal direction with respect to the surface 16 of the support body 15.

According to possible embodiments, the adjustment means 25 can be driven by means of an adjustment tool 26 cooperating with a seating 27 present in the support body 15.

In this way, when the retaining body 19 is anchored to the holding element 20, it is possible to adjust the position of the support body 15, so as to electrically contact the electric contacts 111 on board the electronic board 11 with the counterpart of electric contacts 12a present in the electric connector 12, and to effectively couple thermally the surface 16 of the support body 15 with the heat dissipation surface 14 of the support plate 13.

This guarantees a reliable mechanical and electric coupling, as well as a reliable and extensive heat coupling that allows to effectively dissipate the heat generated by the electronic board 11 through the heat dissipation surface 14.

Furthermore, the coupling can also be obtained in collaboration with possible other mechanical attachment means, such as retaining handles, attachment clips or other attachment means.

According to possible embodiments, the adjustment means 25 can comprise a motion conversion member 28 suitable to convert a rotation motion of the adjustment tool 26 into a translation motion that moves the retaining body 19 orthogonally to the surface 16 of the body support 15.

For example, the motion conversion member 28 can comprise pinions, gears, toothed wheels, coupled orthogonal screws, or other mechanisms that allow to convert a rotation motion into a translation motion of the retaining body 19 and of the main body 23 connected thereto.

According to possible embodiments, the adjustment means 25 can also be made using commanded actuators, by inserting the rotation tool 26 in the seating 27, or other known types of drive.

Figure 3:
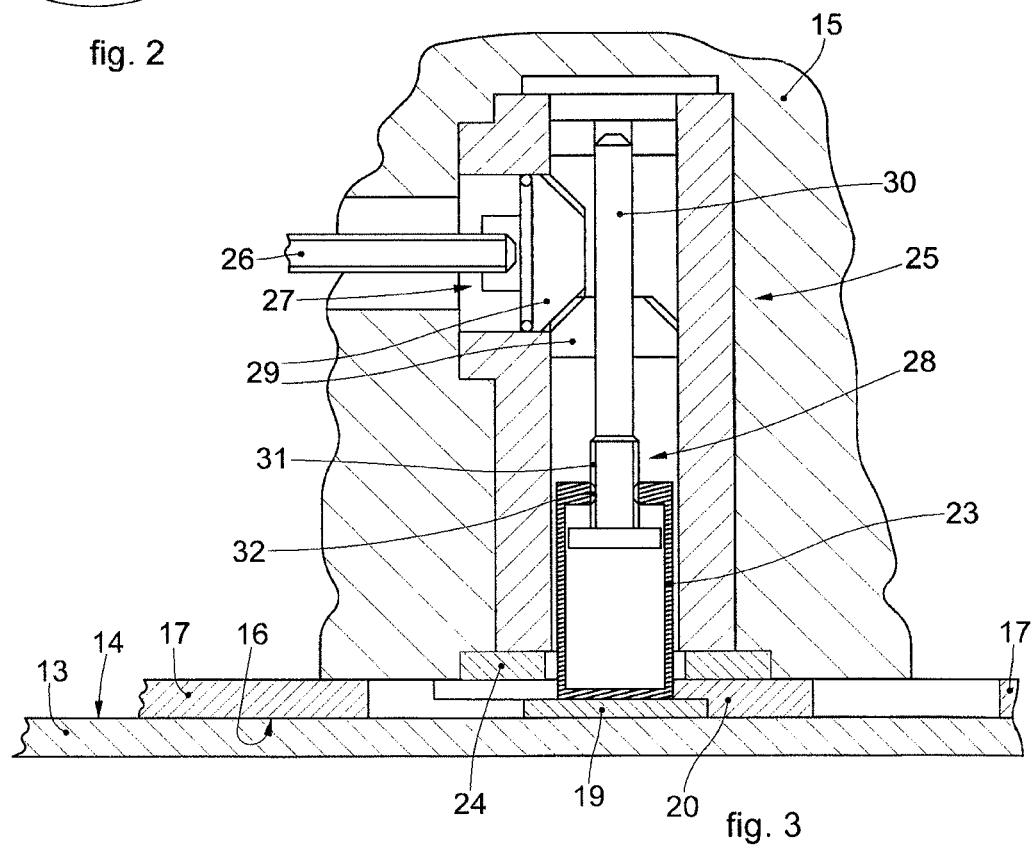
FIG. 3 is a section view of a possible embodiment of a leveler member according to the present invention.
Figure 4:
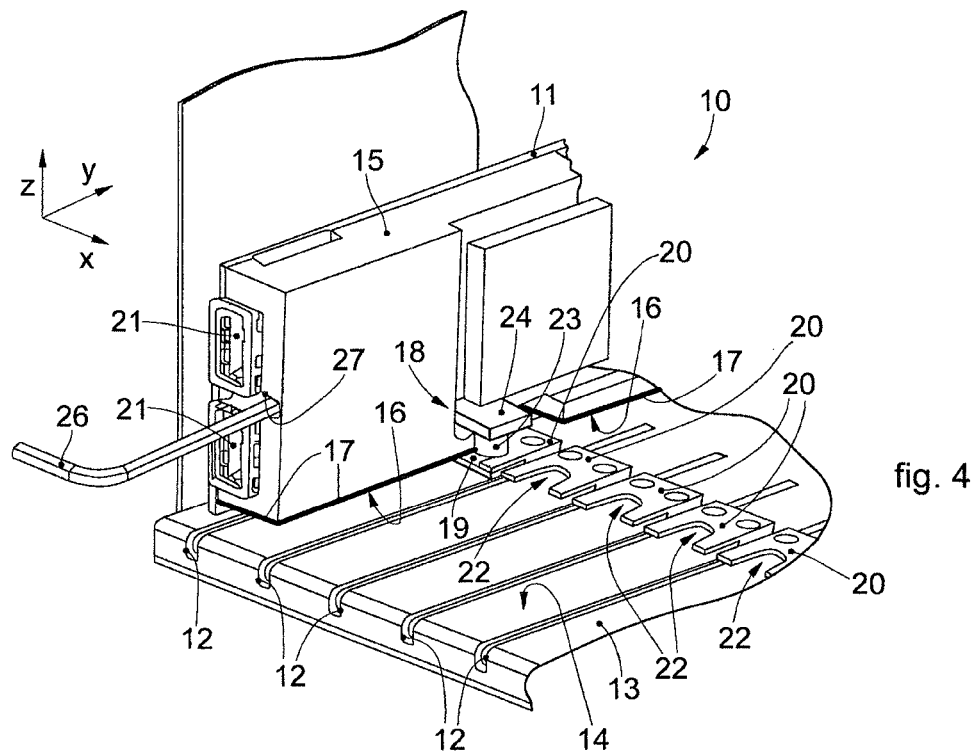
FIGS. 4 and 5 are two perspective views of a heat dissipation device in coupled and non-coupled configuration with the support plate.
Figure 5:
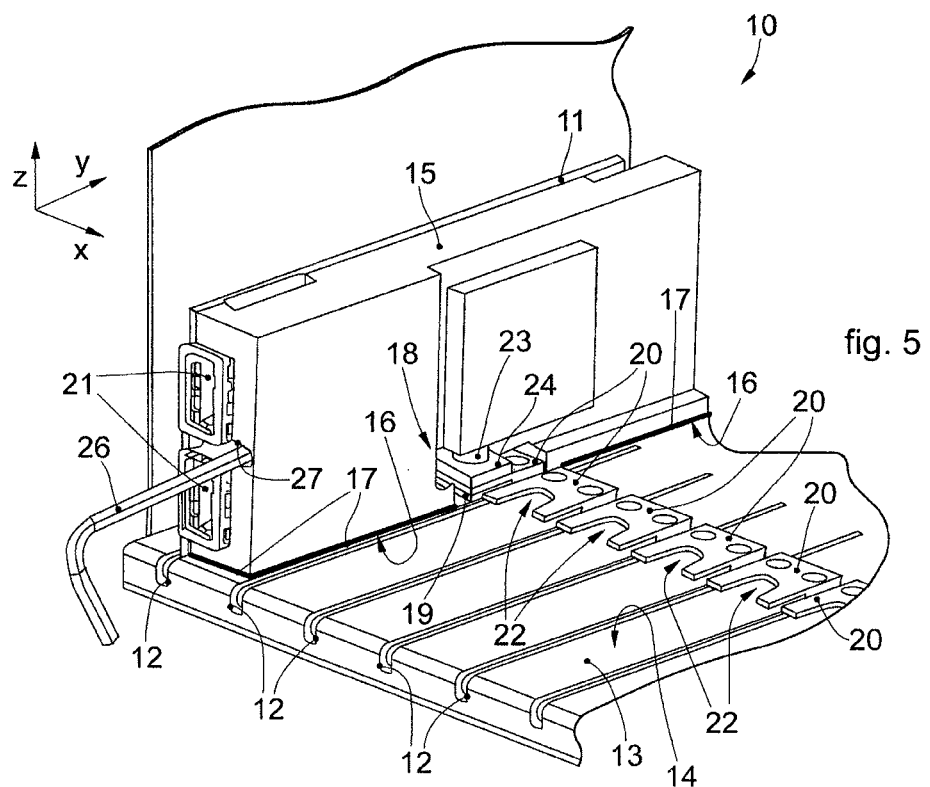
Figure 6:
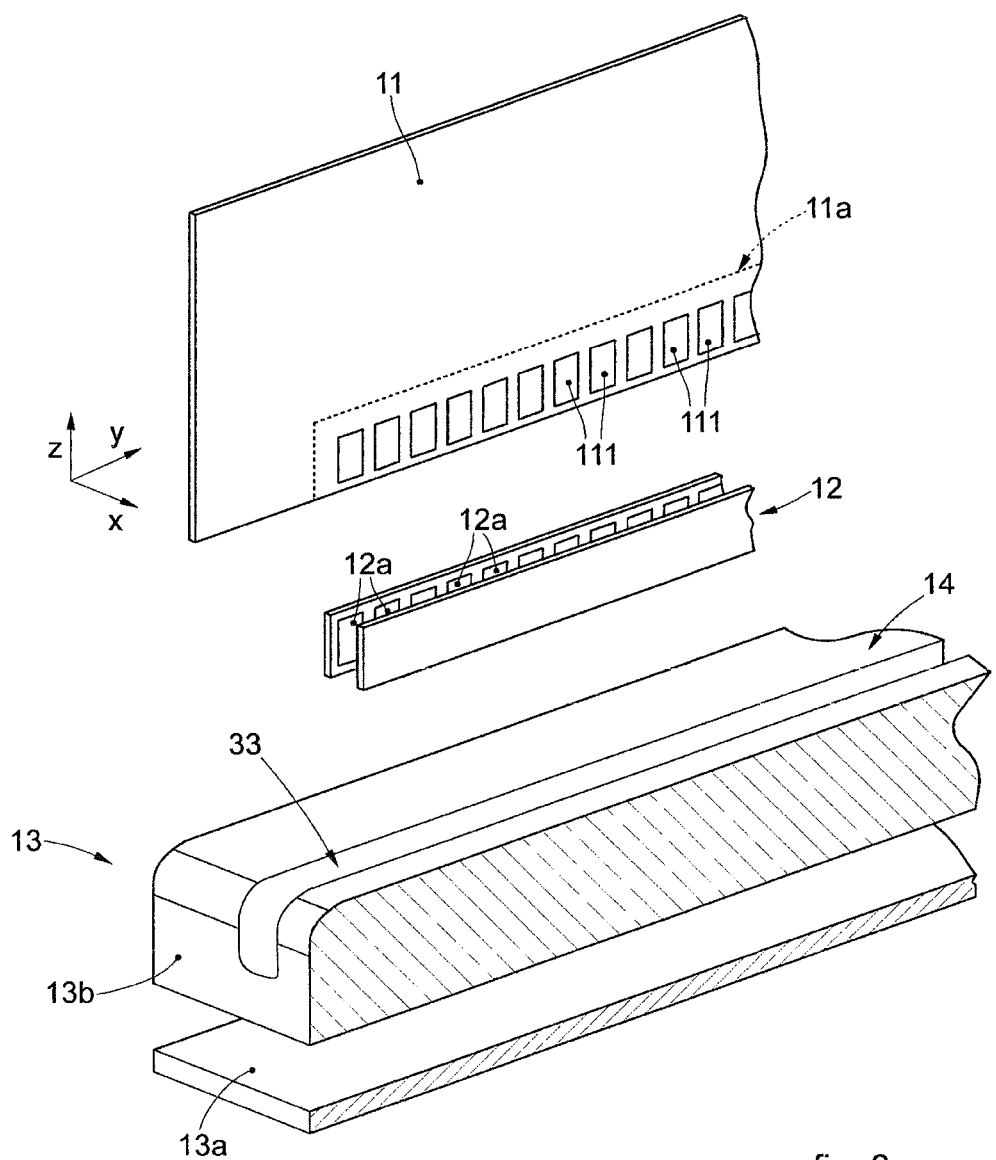
FIG. 6 shows an exploded detail of an electronic board associable with a heat dissipation device according to the present invention.

With reference to FIG. 3, a possible embodiment of adjustment means 25 is shown, in which the motion conversion member 28 comprises a pair of toothed wheels 29, one of which is integral with a shaft 30 which, when driven by means of the adjustment tool 26, make the shaft 30 rotate.

The shaft 30 has a threaded portion 31 which, following the rotation driven by the adjustment tool 26, allows the retaining body 19 to slide orthogonally with respect to the surface 16 of the support body 15. In this case, the support body 19 is integrated with the main body 23 to form a single body.

The sliding of the retaining body 19 is obtained thanks to the coupling of a threaded portion 32 of the latter with the threaded portion 31 of the shaft 30.

According to possible embodiments, the support body 15 can comprise a guide element to correctly position the electronic board 11 in a defined position.

According to other embodiments, the retaining body 19 of the leveling member 18 can comprise a guide element located below the retaining body 19, so as to function as a guide for the correct insertion of the electronic board 11.

The possibility of adjusting from outside the support body 15 the position thereof in an orthogonal direction with respect to the heat dissipation surface 14, by means of an adjustment tool 26, allows to install/remove an orthogonally inserted electronic board 11 even when the access and positioning of the electronic board 11 with respect to the electric connector 12 is possible in only one direction, defined by the direction of the longitudinal extension of the electric connector 12.

In the case of high performance computing, or in any case systems with very high power density, the solution described above allows to maximize system integration in all development directions of the system itself.

In particular, in direction X, corresponding to the width of the support plate 13, the invention allows to pack and even put in contact two adjacent electronic boards 11, that is, in the case of electronic boards 11 distanced in direction X according to a defined pitch, this means minimizing the pitch.

In direction Y, corresponding to the direction of insertion of the electronic board 11 into the system, that is, along the extension of the electric connector 12, the invention allows to maximize the integration, since in order to achieve an efficient heat dissipation no additional volume is used compared to the volume provided by the electronic board 11.

This allows to make "back to back" solutions, that is, it allows to insert electronic boards 11 both on a front side and also on the opposite side in the same volume of standard rack systems, so as to double the overall density of the system.

In direction Z, corresponding to the vertical extension of the electronic board 11, the invention allows to minimize the volume, since in the case of the electronic boards 11 in question, the volume is given by the maximum insertion depth of the electric contacts 111 in the electric connector 12.

Furthermore, thanks to the present invention, it is possible to extend and facilitate the assembly operations of the processing units, allowing to install the electronic boards 11 accurately and precisely even in vertical, and/or inclined configurations, and/or with limited space.

According to possible embodiments, not shown, the holding element 20 can comprise further adjustment means able to position the holding element 20, or at least the portion that engages the retaining body 19, in an orthogonal direction with respect to the heat dissipation surface 14 of the support plate 13.

These further adjustment means can be made in the same or similar way as the adjustment means are made.

According to possible formulations, the present invention also concerns a method to install/remove a heat dissipation device 10 for an electronic board 11 inserted orthogonally inside one of the electric connectors 12.

According to another aspect of the present invention, the method to insert/remove the heat dissipation device 10 comprises:
- a step of engaging/disengaging a retaining body 19 with at least one holding element 20 provided on a heat dissipation surface 14;
- a step of positioning a surface 16 of a support body 15 in an orthogonal direction with respect to the heat dissipation surface 14 until the surface 16 suitable for heat transmission is coupled with/decoupled from the heat dissipation surface 14, positioning at least one of either the retaining body 19 or the holding element 20 in an orthogonal direction with respect to the surface 16 of the support body 15 or to the heat dissipation surface 14 of the support plate 13, respectively.

According to possible embodiments, the step of positioning the heat dissipation device 10 is carried out by means of compression/decompression.

According to possible embodiments, the method to insert/remove the heat dissipation device 10 also provides a step of sliding in a guide element, for example defined by a groove 33, in the direction Y of inserting/removing the electronic board 11 in the processing unit.

According to possible embodiments, the method to insert/remove a heat dissipation device 10 can also provide a step of positioning the retaining body 19 in an orthogonal direction with respect to the surface 16 of the support body 15, performed by means of the adjustment means 25.

According to possible embodiments, the method to insert/remove a heat dissipation device 10 can also provide a step of positioning the holding element 20 in an orthogonal direction with respect to the heat dissipation surface 14 of the support plate 13.

It is clear that modifications and/or additions of parts can be made to the heat dissipation device, and respective insertion/removal method as described heretofore, without departing from the field and scope of the present invention.

The invention claimed is:

1. A heat dissipation device for an electronic board comprising a support body connected to said electronic board, wherein said electronic board is provided with an electric connection interface which can be inserted into/extracted from an electric connector provided on a support plate in a direction orthogonal with respect to a lying plane of said support plate, wherein said support plate has a heat dissipation surface configured to dissipate heat transmitted to the heat dissipation surface by thermal conduction, wherein the heat dissipation device further comprises:
   at least one holding element provided on said heat dissipation surface; and
   a leveling member, connected to said support body, said leveling member comprising:
      a retaining body coordinated with said at least one holding element in order to position a support surface of said support body, said support surface designated for the transmission of the heat, in contact with said heat dissipation surface,
      at least one of:
         said retaining body being positionable in a direction orthogonal with respect to said support surface of said support body, or
         said at least one holding element being positionable in a direction orthogonal with respect to said heat dissipation surface of said support plate,
      a main body connected to said retaining body, said main body positionable orthogonally with respect to said support surface, and
      another retaining body disposed in a predetermined position of said main body, said predetermined position being defined so that, during working, said another retaining body cooperates with said retaining body to clamp in a vise-like manner a portion of said at least one holding element.

2. The heat dissipation device as in claim 1, wherein said leveling member further comprises an adjustment means able to position said retaining body in said direction orthogonal with respect to said support surface of said support body.

3. The heat dissipation device as in claim 2, wherein said adjustment means is configured to be driven by an adjustment tool cooperating with a seating present in said support body.

4. The heat dissipation device as in claim 3, wherein said adjustment means comprise a motion conversion member to convert a rotation motion of said adjustment tool into a translation motion that moves said retaining body orthogonally with respect to said support surface of said support body.

5. The heat dissipation device as in claim 4, wherein said support body is connected laterally to said electronic board, said support surface of said support body being orthogonal with respect to a direction of insertion of said electronic board in said electric connector.

6. The heat dissipation device as in claim 4, wherein said support body comprises one or more elements chosen from a group consisting of: electric or electronic components; dispersion, dissipation and thermal interface elements; a support electronic board coupled with said electronic board; and connectors.

7. The heat dissipation device as in claim 3, wherein said support body is connected laterally to said electronic board, said support surface of said support body being orthogonal with respect to a direction of insertion of said electronic board in said electric connector.

8. The heat dissipation device as in claim 3, wherein said support body comprises one or more elements chosen from a group consisting of: electric or electronic components; dispersion, dissipation and thermal interface elements; a support electronic board coupled with said electronic board; and connectors.

9. The heat dissipation device as in claim 2, wherein said support body is connected laterally to said electronic board, said support surface of said support body being orthogonal with respect to a direction of insertion of said electronic board in said electric connector.

10. The heat dissipation device as in claim 2, wherein said support body comprises one or more elements chosen from a group consisting of: electric or electronic components; dispersion, dissipation and thermal interface elements; a support electronic board coupled with said electronic board; and connectors.

11. The heat dissipation device as in claim 1, wherein said support body is connected laterally to said electronic board, said support surface of said support body being orthogonal with respect to a direction of insertion of said electronic board in said electric connector.

12. The heat dissipation device as in claim 1, wherein said support body comprises one or more elements chosen from a group consisting of: electric or electronic components; dispersion, dissipation and thermal interface elements; a support electronic board coupled with said electronic board; and connectors.

13. The heat dissipation device as in claim 1, wherein said support surface of said support body comprises a heat conductive interface.

14. A method to install/remove the heat dissipation device as in claim 1, wherein said method provides:
a step of engaging/disengaging the retaining body with/from the at least one holding element provided on said heat dissipation surface; and
a step of positioning the support surface of said support body in the direction orthogonal with respect to said heat dissipation surface until said support surface suitable for heat transmission is coupled with/uncoupled from said heat dissipation surface, positioning at least one of:
said retaining body in the direction orthogonal with respect to said support surface of said support body, or
said at least one holding element in the direction orthogonal with respect to said heat dissipation surface of said support plate.

* * * * *